(12) United States Patent
Wu et al.

(10) Patent No.: US 11,611,024 B2
(45) Date of Patent: Mar. 21, 2023

(54) DISPLAY DEVICE

(71) Applicant: Au Optronics Corporation, Hsinchu (TW)

(72) Inventors: Shang-Jie Wu, Hsinchu (TW); Yu-Chieh Kuo, Hsinchu (TW); He-Yi Cheng, Hsinchu (TW); Che-Chia Chang, Hsinchu (TW); Yi-Jung Chen, Hsinchu (TW); Yi-Fan Chen, Hsinchu (TW); Yu-Hsun Chiu, Hsinchu (TW); Mei-Yi Li, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 434 days.

(21) Appl. No.: 17/009,787

(22) Filed: Sep. 2, 2020

(65) Prior Publication Data

US 2021/0151650 A1    May 20, 2021

(30) Foreign Application Priority Data

Nov. 15, 2019   (TW) ................... 108141625

(51) Int. Cl.
*H01L 33/62* (2010.01)
*G09G 3/32* (2016.01)
*H01L 27/15* (2006.01)

(52) U.S. Cl.
CPC .............. *H01L 33/62* (2013.01); *G09G 3/32* (2013.01); *H01L 27/156* (2013.01)

(58) Field of Classification Search
CPC combination set(s) only.
See application file for complete search history.

(56) References Cited

U.S. PATENT DOCUMENTS

| 9,013,098 | B1 | 4/2015 | Kim et al. |
| 10,311,779 | B2 | 6/2019 | Zhang |
| 2015/0129856 | A1 | 5/2015 | Kim et al. |
| 2015/0251402 | A1* | 9/2015 | Cok ..................... G09G 3/3266 156/280 |

(Continued)

FOREIGN PATENT DOCUMENTS

| CN | 102563448 | 7/2012 |
| CN | 103499072 | 1/2014 |
| CN | 104536229 | 4/2015 |

(Continued)

*Primary Examiner* — Ratisha Mehta
(74) *Attorney, Agent, or Firm* — JCIPRNET

(57) ABSTRACT

A display device includes a substrate and pixels. The substrate has an intermediate region and a peripheral region. Each of the pixels includes sub-pixels. Each of the sub-pixels includes a pad group and a light emitting diode (LED) element. The pad group has a first pad and a second pad. The LED element is electrically connected to the first pad and the second pad. The pixels include standard pixels disposed in the intermediate region and peripheral pixels disposed in the peripheral region. The first pads and the second pads of the pad groups of the sub-pixels of each of the standard pixels are arranged in a first direction. The peripheral pixels include a first peripheral pixel. The first pads and the second pads of the pad groups of the sub-pixels of the first peripheral pixel are arranged in a second direction, and the first direction crosses over the second direction.

10 Claims, 13 Drawing Sheets

(56) References Cited

U.S. PATENT DOCUMENTS

2016/0189607 A1    6/2016  Zhang
2019/0005780 A1*  1/2019  Nelson .................. G07F 17/326

FOREIGN PATENT DOCUMENTS

| CN | 104537993 | 4/2015 |
| CN | 106782416 | 5/2017 |
| CN | 106898298 | 6/2017 |
| CN | 109448566 | 3/2019 |

* cited by examiner

DISPLAY DEVICE

CROSS-REFERENCE TO RELATED APPLICATION

This application claims the priority benefit of Taiwan patent application serial no. 108141625, filed on Nov. 15, 2019. The entirety of the above-mentioned patent application is hereby incorporated by reference herein and made a part of this specification.

BACKGROUND

Technical Field

The disclosure relates to a photoelectric device, and in particular, to a display device.

Description of Related Art

A light emitting diode (LED) display panel includes an active device substrate and a plurality of LED elements transposed on the active device substrate. In view of characteristics of the LED, the LED display panel has advantages of low power consumption, high efficiency, high brightness, quick respons6e, and so on. In addition, in comparison to an organic LED display panel, the LED display panel further has advantages of easy color adjustment, long light emitting life, no image imprinting, and the like. Therefore, the LED display panel is deemed as a display technology of the next generation. However, since pixels of the LED display panel include pads and driving circuits in addition to the LED elements, it is not easy to realize a LED display panel with a slim frame design or even without frames.

SUMMARY

The disclosure provides a display device with a slim frame design or even without frames.

According to an embodiment of the disclosure, a display device includes a substrate and a plurality of pixels. The substrate has an intermediate region and a peripheral region, and the peripheral region is located between an edge of the substrate and the intermediate region. The pixels are disposed on the substrate. Each of the pixels includes a plurality of sub-pixels. Each of the sub-pixels includes a pad group and a LED element. The pad group includes a first pad and a second pad. The LED element is electrically connected to the first pad and the second pad. The pixels include a plurality of standard pixels disposed in the intermediate region and a plurality of peripheral pixels disposed in the peripheral region. The first pad and the second pad of the pad group of each of the sub-pixels of each of the standard pixels are arranged in a first direction. The peripheral pixels include a first peripheral pixel. The first pads and the second pads of the pad groups of the sub-pixels of the first peripheral pixel are arranged in a second direction, and the first direction crosses over the second direction.

In an embodiment of the disclosure, the first pad of each sub-pixel of each standard pixel includes a bonding region overlapping the LED element of each sub-pixel of each standard pixel and a spare region outside the bonding region, and the first pad of each sub-pixel of the first peripheral pixel includes a bonding region overlapping the LED element of each sub-pixel of the first peripheral pixel and a spare region outside the bonding region, a direction in which the bonding region and the spare region of each sub-pixel of each standard pixel are arranged crosses over a direction in which the bonding region and the spare region of each sub-pixel of the first peripheral pixel are arranged.

In an embodiment of the disclosure, the peripheral pixels further include a second peripheral pixel and a third peripheral pixel. The first peripheral pixel and the second peripheral pixel are arranged in one of the first direction and the second direction, and the first pad and the second pad of each sub-pixel of the second peripheral pixel are arranged in the first direction. The third peripheral pixel and one of the standard pixels are arranged in the one of the first direction and the second direction, and the first pad and the second pad of each sub-pixel of the third peripheral pixel are arranged in the first direction. The LED elements electrically connected to the pad groups of the first peripheral pixel, the pad groups of the second peripheral pixel, the pad groups of the third peripheral pixel, and the pad group of the one of the standard pixels respectively are configured to display a same color. A distance p' exists between the first pad of each pad group of the first peripheral pixel and the first pad of each pad group of the second peripheral pixel in the one of the first direction and the second direction, a distance p exists between the first pad of each pad group of the third peripheral pixel and the first pad of each pad group of the standard pixel in the one of the first direction and the second direction, and the distance p' is different from the distance p.

In an embodiment of the disclosure, the peripheral pixels further include a fourth peripheral pixel. The first peripheral pixel, the fourth peripheral pixel, and one of the standard pixels are sequentially arranged in one of the first direction and the second direction, and the first pad and the second pad of each sub-pixel of the fourth peripheral pixel are arranged in the second direction. The LED elements electrically connected to the pad groups of the first peripheral pixel, the pad groups of the fourth peripheral pixel, and the pad groups of one of the standard pixels respectively are configured to display a same color. A distance p exists between the first pad of each pad group of the first peripheral pixel and the first pad of each pad group of the fourth peripheral pixel in the one of the first direction and the second direction, a distance p' exists between the first pad of each pad group of the fourth peripheral pixel and the first pad of each pad group of one of the standard pixels in the one of the first direction and the second direction, and the distance p' is different from the distance p.

In an embodiment of the disclosure, the distance p and the distance p' satisfy: |p'−p|/p≤5%.

According to an embodiment of the disclosure, another display device includes a substrate and a plurality of pixels. The substrate has an intermediate region and a peripheral region, where the peripheral region is located between an edge of the substrate and the intermediate region. The pixels are disposed on the substrate. Each of the pixels includes a plurality of sub-pixels. Each of the sub-pixels includes a pixel driving circuit, a first pad group, and a LED element. The pixel driving circuit includes a first transistor and a second transistor, where the first transistor includes a first terminal, a second terminal, and a control terminal, and the second transistor includes a first terminal, a second terminal, and a control terminal. The second terminal of the first transistor is electrically connected to the control terminal of the second transistor. The first pad group includes a first pad and a second pad, where the first pad is electrically connected to the second terminal of the second transistor. The LED element is electrically connected to the first pad and the second pad. The pixels include a plurality of standard pixels disposed in the intermediate region and a plurality of peripheral pixels disposed in the peripheral region. The first pad and the second pad of the first pad group of each of the sub-pixels of each of the standard pixels are arranged in a first direction. The peripheral pixels include a first peripheral pixel, and the first pad and the second pad of the first pad group of each sub-pixel of the first peripheral pixel are arranged in the first direction. Each sub-pixel of the first peripheral pixel further includes a second pad group that includes a third pad and a fourth pad, and the first pad, the second pad, the third pad, and the fourth pad of the first peripheral pixel are structurally separated. The third pad is electrically connected to the second terminal of the second transistor of each sub-pixel of the first peripheral pixel, and the third pad and the fourth pad are arranged in a second direction. The first direction crosses over the second direction.

In an embodiment of the disclosure, an area of the first pad of the first pad group of each sub-pixel of the first peripheral pixel is less than an area of the first pad of the first pad group of each sub-pixel of each standard pixel.

In an embodiment of the disclosure, an area of the third pad of the second pad group of each sub-pixel of the first peripheral pixel is less than an area of the first pad of the first pad group of each sub-pixel of each standard pixel.

In an embodiment of the disclosure, the peripheral pixels further include a second peripheral pixel. The first peripheral pixel is disposed between the edge of the substrate and the second peripheral pixel. The first pad and the second pad of the first pad group of each sub-pixel of the second peripheral pixel are arranged in the first direction. Each sub-pixel of the second peripheral pixel further includes a second pad group, and the second pad group of each sub-pixel of the second peripheral pixel includes a third pad and a fourth pad, where the third pad of the second pad group of each sub-pixel of the second peripheral pixel is electrically connected to the second terminal of the second transistor of each sub-pixel of the second peripheral pixel. The third pad and the fourth pad of the second pad group of each sub-pixel of the second peripheral pixel are arranged in the second direction, and an area of the third pad of the second pad group of each sub-pixel of the second peripheral pixel is greater than an area of an third pad of the second pad group of each sub-pixel of the first peripheral pixel and less than the area of the first pad of the first pad group of each sub-pixel of each standard pixel.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
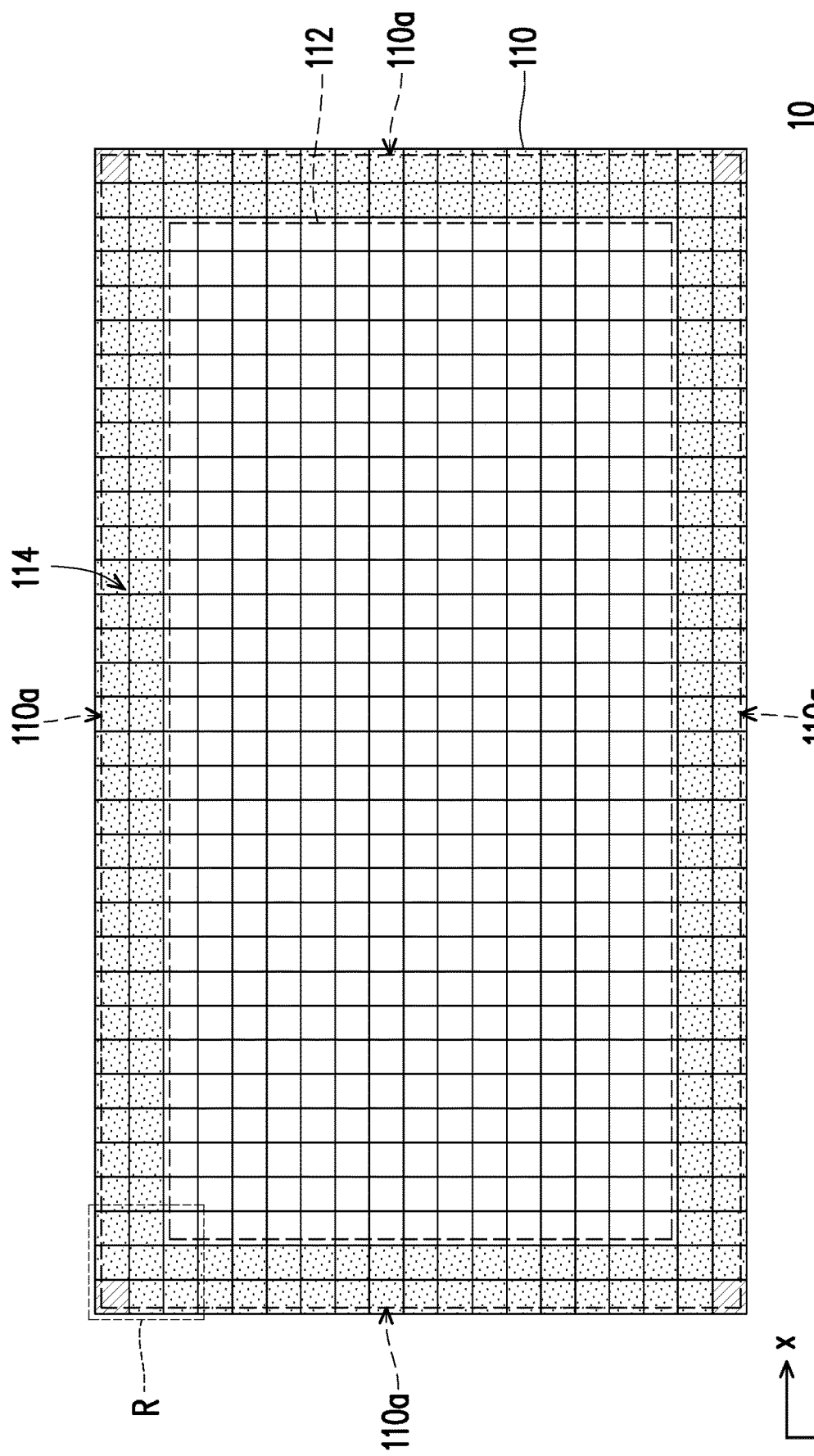
FIG. 1 is a schematic top view of a display device 10 according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Directional terminology used in the embodiments, such as "top", "bottom", "front", "back", "left", "right", etc., is used with reference to the orientation of the figure(s) being described and are not intended to be limiting of the disclosure. In the drawings, general characteristics of methods, structures, and/or materials used in specific embodiments are illustrated. However, these drawings should not be construed to define or limit a scope or nature covered by these embodiments. For instance, for simplicity's sake, a relative size, thickness, and location of each film layer, region, and/or structure may be reduced or enlarged. It will be understood that when a component such as a layer, a film, a region, or a substrate is referred to be "on" or "connected to" another component, it may be directly on or connected to the other another component, or intermediate components may also exist there between. Comparatively, when a component is referred to be "directly on" or "directly connected" to another, no other intermediate component exits there between. As used herein, the "connection" may refer to physical and/or electrical connection. Furthermore, "electrical connection" or "coupling" of two components may refer to that other components may exist between the two components.

"About", "approximate", or "substantial" used in the specification includes a stated value and an average value within an acceptable deviation range from a specific value determined by those with ordinary skills in the art while considering the discussed measurement and a specific number of errors associated with the measurement (i.e. limits of a measurement system). For instance, "about" may represent to be within one or more standard deviations of the stated value, or within ±30%, ±20%, ±10%, and ±5%. Moreover, an acceptable deviation range or standard deviation may be selected for the "about", "approximate" or "substantial" used in the specification based on optical properties, etching properties, or other properties without using one standard deviation for all properties.

Unless otherwise defined, all terms (including technical and scientific terms) used herein have the same meaning as commonly understood by one of ordinary skill in the art to which the disclosure belongs. It will be further understood that terms such as those defined in commonly used dictionaries should be interpreted as having a meaning that is consistent with their meaning in the context of the relevant art and the disclosure and will not be interpreted in an idealized or overly formal sense unless expressly so defined herein.

FIG. 1 is a schematic top view of a display device 10 according to an embodiment of the disclosure. FIG. 1 shows a substrate 110 but omits other components of the display device 10.

Figure 2:
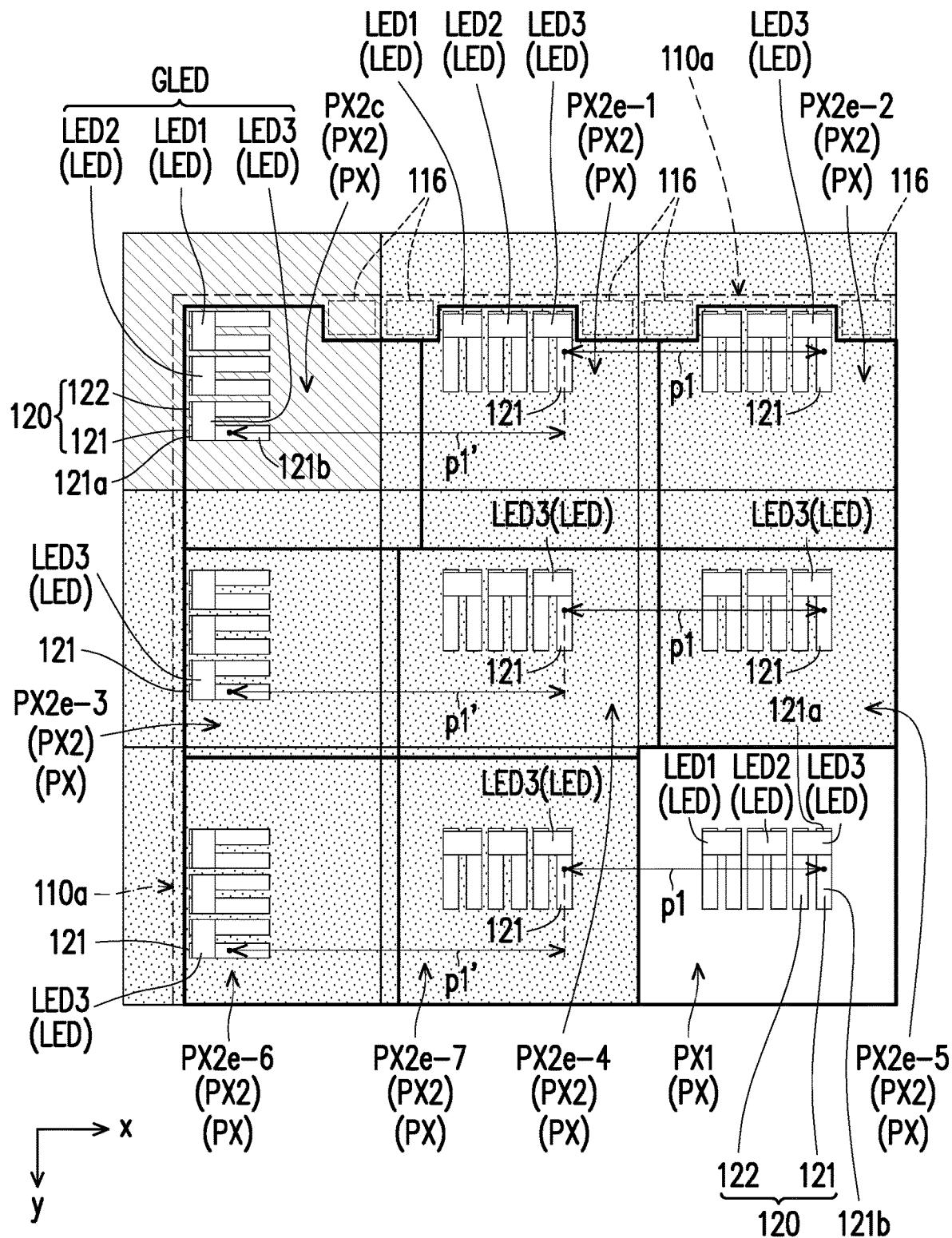
FIG. 2 is a schematic partially-enlarged view of the display device 10 according to an embodiment of the disclosure.

FIG. 2 is a schematic partially-enlarged view of the display device 10 according to an embodiment of the disclosure. FIG. 2 corresponds to a region R of FIG. 1. FIG. 2 shows a plurality of first pads 121, a plurality of second pads 122, a plurality of LED elements LED, and side pad regions 116 of the substrate 110, but omits other components of the display device 10.

Figure 3:
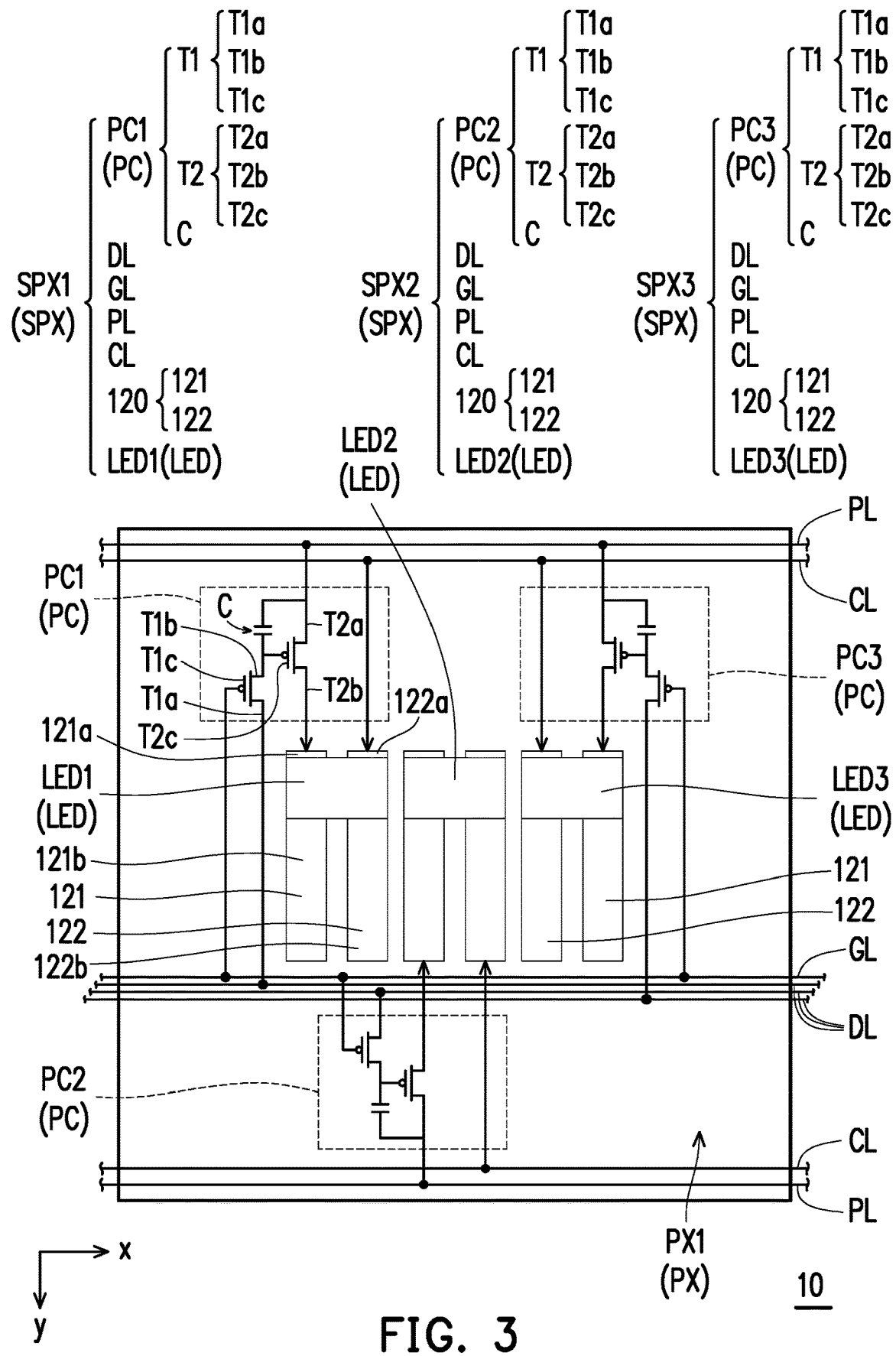
FIG. 3 is a schematic enlarged view of a standard pixel PX1 in FIG. 2.

FIG. 3 is a schematic enlarged view of a standard pixel PX1 of FIG. 2.

Figure 4:
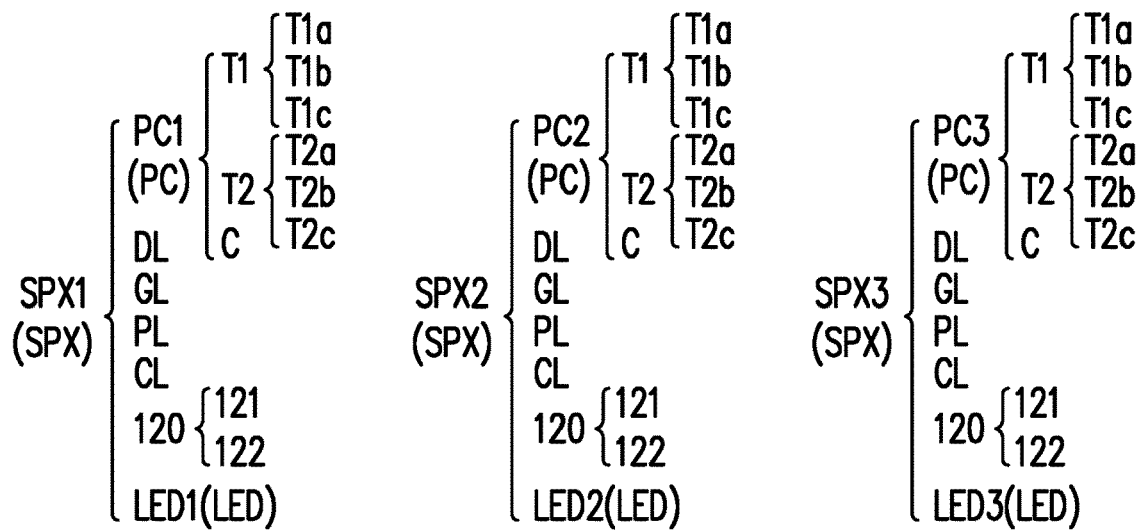
FIG. 4 is a schematic enlarged view of a peripheral pixel PX2 in FIG. 2.
Figure 4:
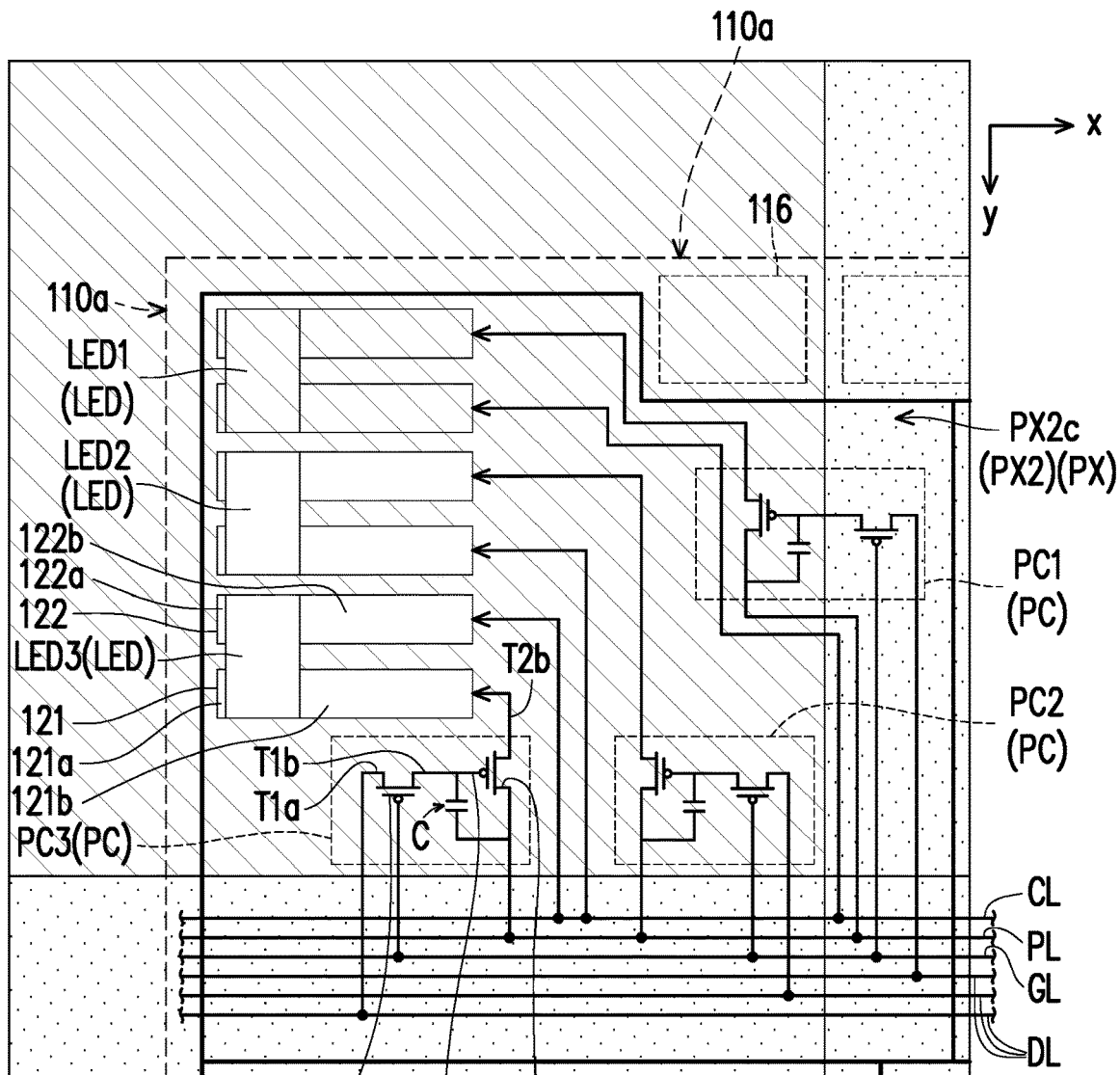

FIG. 4 is a schematic enlarged view of a peripheral pixel PX2 of FIG. 2.

Referring to FIG. 1 and FIG. 2, the display device 10 includes the substrate 110. For example, in this embodiment, the substrate 110 may be made of glass, quartz, an organic polymer, an opaque/reflective material (for example, a wafer, ceramic, or other applicable materials), or other applicable materials.

The substrate 110 has an intermediate region 112 and a peripheral region 114. The peripheral region 114 is located between at least one edge 110a of the substrate 110 and the intermediate region 112. For example, in this embodiment, the peripheral region 114 may be located between all edges 110a of the substrate 110 and the intermediate region 112, and the peripheral region 114 may be an annular region surrounding the intermediate region 112, but the disclosure is not limited thereto.

It should be noted that the substrate 110 that has not been cut from a motherboard thereof is shown in the figure, and the edge 110a of the substrate 110 cut from the motherboard is approximately as a dotted line indicated by the edge 110a in the figure.

The display device 10 includes a plurality of pixels PX disposed on the substrate 110. A plurality of LED elements LED of the same pixel PX constitute a LED element group GLED. A plurality of LED element groups GLED of the pixels PX are arranged on the substrate 110 in an array. The pixel PX of the LED element group GLED thereof located in the intermediate region 112 (represented by a blank pattern) is referred to as a standard pixel PX1. The pixel PX of the LED element group GLED thereof located in the peripheral region 114 (indicated by a diagonal pattern and a dotted pattern) is referred to as a peripheral pixel PX2.

In this embodiment, the peripheral pixels PX2 include corner pixels PX2c and a plurality of edge pixels PX2e-1 to PX2e-7, and each of the corner pixels PX2c is disposed beside the junction of the two edges 110a of the substrate 110 (i.e., disposed at the corner indicated by a diagonal pattern). The edge pixels PX2e-1 to PX2e-7 are disposed beside the edge 110a of the substrate 110 and in a region (represented by a dotted pattern) that is not a corner.

In this embodiment, the peripheral pixels PX2 (for example, the corner pixels PX2c and the edge pixels PX2e-1 to PX2e-7) corresponding to two adjacent edges 110a of the substrate 110 may be roughly arranged in two columns and two rows. However, the disclosure is not limited thereto, and the number of columns and rows of the peripheral pixels PX2 corresponding to two adjacent edges 110a of the substrate 110 may be appropriately changed according to actual requirements. For example, in another embodiment, the peripheral pixels PX2 of two adjacent edges 110a of the substrate 110 may alternatively be arranged in three columns and three rows.

Referring to FIG. 2 and FIG. 3, in this embodiment, a side pad region 116 may be provided between a column of peripheral pixels PX2 (for example, corner pixels PX2c, edge pixels PX2e-1, and edge pixels PX2e-2) closest to an edge 110a of the substrate 110 and the edge 110a of the substrate 110. The substrate 110 has a front surface (that is, the paper surface of FIG. 1), a back surface opposite to the front surface, and a side wall connected between the front surface and the back surface. The LED element LED is disposed on the front surface of the substrate 110. Side pads (not shown) may be disposed on the side pad region 116 of the front surface of the substrate 110. The side pads are electrically connected to wires (not shown) on the side wall of the substrate 110, and data lines DL, scanning lines GL, power lines PL, common lines CL, or other components on the front surface of the substrate 110 may be electrically connected to fan-out wires (not shown) and/or wafers (not shown) on the back surface of the substrate 110 through the side pads and wires on the side wall of the substrate 110.

Each of the pixels PX includes a plurality of sub-pixels SPX. In this embodiment, each of the sub-pixels SPX includes a data line DL, a scanning line GL, a power line PL, a common line CL, a pixel driving circuit PC, a pad group 120, and a LED element LED. The pixel driving circuit PC of each of the sub-pixels SPX includes a first transistor T1, a second transistor T2, and a capacitor C. A first terminal T1a of the first transistor T1 is electrically connected to the data line DL. A control terminal T1c of the first transistor T1 is electrically connected to the scanning line GL. A second terminal T1b of the first transistor T1 is electrically connected to a control terminal T2c of the second transistor T2. A first terminal T2a of the second transistor T2 is electrically connected to the power line PL. The capacitor C is electrically connected the second terminal T1b of the first transistor T1 is to the first terminal T2a of the second transistor T2. The pad group 120 includes a first pad 121 and a second pad 122 that are adjacent to and separated from each other. The first pad 121 is electrically connected to a second terminal T2b of the second transistor T2. The second pad 122 is electrically connected to the common line CL. A first electrode (not shown) and a second electrode (not shown) of the LED element LED are electrically connected to the first pad 121 and the second pad 122, respectively.

In this embodiment, the pixel driving circuit P includes two transistors (that is, the first transistor T1 and the second transistor T2) and one capacitor C. For example, in this embodiment, the pixel driving circuit P may optionally include six transistors (other four transistors other than the first and second transistors T1 and T2, not shown) and one capacitor C. That is, in this embodiment, the pixel driving circuit PC may optionally adopt a 6T1C structure. However, the disclosure is not limited thereto. In other embodiments, the pixel driving circuit PC may adopt other structure, for example but not limited to, a 1T1C structure, a 2T1C structure, a 3T1C structure, a 3T2C structure, a 4T1C structure, a 4T2C structure, a 5T1C structure, a 5T2C structure, a 6T2C structure, a 7T2C structure, or any possible structure.

In this embodiment, the LED device LED of each of the sub-pixels SPX is transferred from a growth substrate (not shown) to an active device substrate including the substrate 110, the data line DL, the scanning line GL, the power line PL, the common line CL, the pixel driving circuit PC, and the pad group 120, thereby forming the display device 10. For example, in this embodiment, the LED element LED may be first formed on a sapphire substrate, and then be transposed onto the pad group 120 of the active device substrate, and the LED element LED may be an inorganic LED element, for example but not limited to: a micro LED, a sub-millimeter LED (mini LED), or an inorganic LED of other sizes.

In this embodiment, each of the pixels PX may include a first sub-pixel SPX1, a second sub-pixel SPX2, and a third sub-pixel SPX3. The LED element LED1 of the first sub-pixel SPX1, the LED element LED2 of the second sub-pixel SPX2, and the LED element LED3 of the third sub-pixel SPX3 are respectively configured to emit first color light, second color light, and third color light, so that the first sub-pixel SPX1, the second sub-pixel SPX2, and the third sub-pixel SPX3 may display a first color, a second color, and a third color, respectively. For example, in this embodiment, the first color, the second color, and the third color may be red, green, and blue, respectively, but the disclosure is not limited thereto.

Referring to FIG. 2, FIG. 3, and FIG. 4, it should be noted that the first pad 121 and the second pad 122 of the pad group 120 of each of the sub-pixels SPX of each standard pixel PX1 are arranged in the first direction x, and the first pad 121 and the second pad 122 of the pad group 120 of each of the sub-pixels SPX of at least one peripheral pixel PX2 (for example, but not limited to: a corner pixel PX2c, an edge pixel PX2e-3, and an edge pixel PX2e-6) are arranged in the second direction y, and the first direction x crosses over the second direction y. For example, in this embodiment, the first direction x is substantially perpendicular to the second direction y. That is, an included angle between the first direction x and the second direction y may be substantially 90°. However, the disclosure is not limited thereto, and according to other embodiments, the included angle between the first direction x and the second direction y may be other angles other than 90°.

In this embodiment, the direction (that is, the second direction y) in which the first pad 121 and the second pad 122 of the pad group 120 of the at least one peripheral pixel PX2 are arranged is different from the direction (that is, the first direction x) in which the first pad 121 and the second pad 122 of the pad group 120 of the standard pixel PX1 are arranged. In this way, the LED element LED of the at least one peripheral pixel PX2 may be as close as possible to the edge 110a of the substrate 110, thereby achieving the display device 10 with a slim frame design or even without frames.

Referring to FIG. 2, FIG. 3, and FIG. 4, in this embodiment, the first pad 121 of the sub-pixel SPX of each of the pixels PX may have a bonding region 121a overlapping the LED element LED and a spare region 121b outside the bonding region 121a, and the second pad 122 of the sub-pixel SPX of each of the pixels PX may have a bonding region 122a overlapping the LED element LED and a spare region 122b outside the bonding region 122a. When the sub-pixel SPX needs to be repaired, the LED element LED on the bonding regions 121a, 122a of the first pad 121 and the second pad 122 of the sub-pixel SPX may be removed, so that another LED element LED is engaged with the spare regions 121b and 122b of the first pad 121 and the second pad 122 of the sub-pixel SPX.

It should be noted that in this embodiment, the direction (for example, the second direction y) in which the bonding region 121a and the spare region 121b of the first pad 121 of the sub-pixel SPX of the standard pixel PX1 are arranged crosses over the direction (for example, the first direction x) in which the bonding region 121a and the spare region 121b of the first pad 121 of the sub-pixel SPX of the peripheral pixel PX2 (for example, but not limited to the corner pixel PX2c) are arranged.

Referring to FIG. 2, in this embodiment, the corner pixel PX2c and the edge pixel PX2e-1 are arranged in the first direction x, and the first pad 121 and the second pad 122 of the sub-pixel SPX of the edge pixel PX2e-1 are arranged in a first direction x. The edge pixel PX2e-7 and the standard pixel PX1 are arranged in the first direction x, and the first pad 121 and the second pad 122 of the sub-pixel SPX of the edge pixel PX2e-7 are arranged in the first direction x. A plurality of LED elements (for example, but not limited to an LED 3) electrically connected to the pad group 120 of the corner pixel PX2c, the pad group 120 of the edge pixel PX2e-1, the pad group 120 of the edge pixel PX2e-7, and the pad group 120 of standard pixel PX1, respectively, are configured to display the same color. A distance p1' (the distance p1' refers to a distance between two geometric centers of the two first pads 121 in the first direction x) exists between the first pad 121 of the corner pixel PX2c electrically connected to the LED element LED3 and the first pad 121 of the edge pixel PX2e-1 electrically connected to the LED element LED3 in the first direction x. A distance p1 (the distance p1 refers to a distance between the two geometric centers of the two first pads 121 in the first direction x) exists between the first pad 121 of the edge pixel PX2e-7 electrically connected to the LED element LED3 and the first pad 121 of the standard pixel PX1 electrically connected to the LED element LED3 in the first direction x, and the distance p1 is different from the distance p1. For example, the distance p1' and the distance p1 may satisfy:

|p1'−p1|/p1≤5%, but the disclosure is not limited thereto.

It should be noted herein that in the following embodiments, reference numerals and some content of the foregoing embodiments are used, same reference numerals are used to represent same or similar elements, and descriptions about same technical content are omitted. For the omitted descriptions, reference may be made to the foregoing embodiments, and the descriptions thereof are omitted in the following embodiments.

Figure 5:
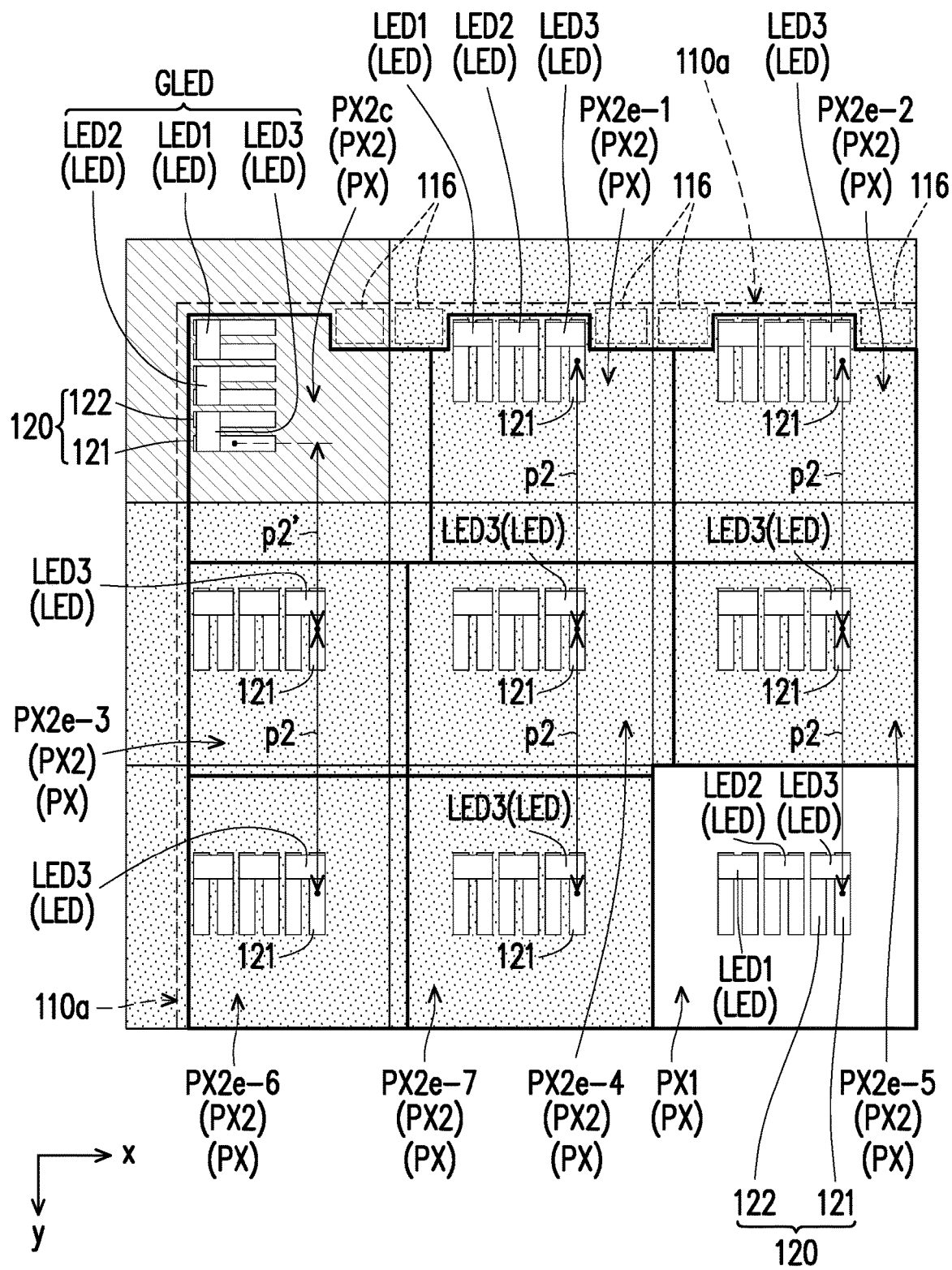
FIG. 5 is a schematic partially-enlarged view of a display device 10A according to another embodiment of the disclosure.

FIG. 5 is a schematic partially-enlarged view of a display device 10A according to another embodiment of the disclosure. The display device 10A of FIG. 5 is similar to the display device 10 of FIG. 2, and a difference between the two is that: in the embodiment of FIG. 2, the first pads 121 and the second pads 122 of edge pixels PX2e-3 and PX2e-6 are arranged in a second direction y; however, in the embodiment of FIG. 5, the first pads 121 and the second pads 122 of the edge pixels PX2e-3 and PX2e-6 are arranged in a first direction x.

In the embodiment of FIG. 5, the corner pixel PX2c and the edge pixel PX2e-3 are arranged in the second direction y, and the first pad 121 and the second pad 122 of the edge pixels PX2e-3 are arranged in the first direction x. The edge pixel PX2e-5 and the standard pixel PX1 are arranged in the second direction y, and the first pad 121 and the second pad 122 of the edge pixel PX2e-5 are arranged in the first direction x. A plurality of LED elements (for example, but not limited to an LED 3) electrically connected to the pad group 120 of the corner pixel PX2c, the pad group 120 of the edge pixel PX2e-3, the pad group 120 of the edge pixel PX2e-5, and the pad group 120 of standard pixel PX1, respectively, are configured to display the same color. A distance p2' (the distance p2' refers to a distance between two geometric centers of the two first pads 121 in the second direction y) exists between the first pad 121 of the pad group 120 of the corner pixel PX2c and the first pad 121 of the pad group 120 of the edge pixel PX2e-3 in the second direction y. A distance p2 (the distance p2 refers to a distance between two geometric centers of the two first pads 121 in the second direction y) exists between the first pad 121 of the pad group 120 of the edge pixel PX2e-5 and the first pad 121 of the pad group 120 of the standard pixel PX1 in the second direction y, and the distance p2' is different from the distance p2. For example, the distance p2' and the distance p2 may satisfy: |p2'−p2|/p2≤5%, but the disclosure is not limited thereto.

Figure 6:
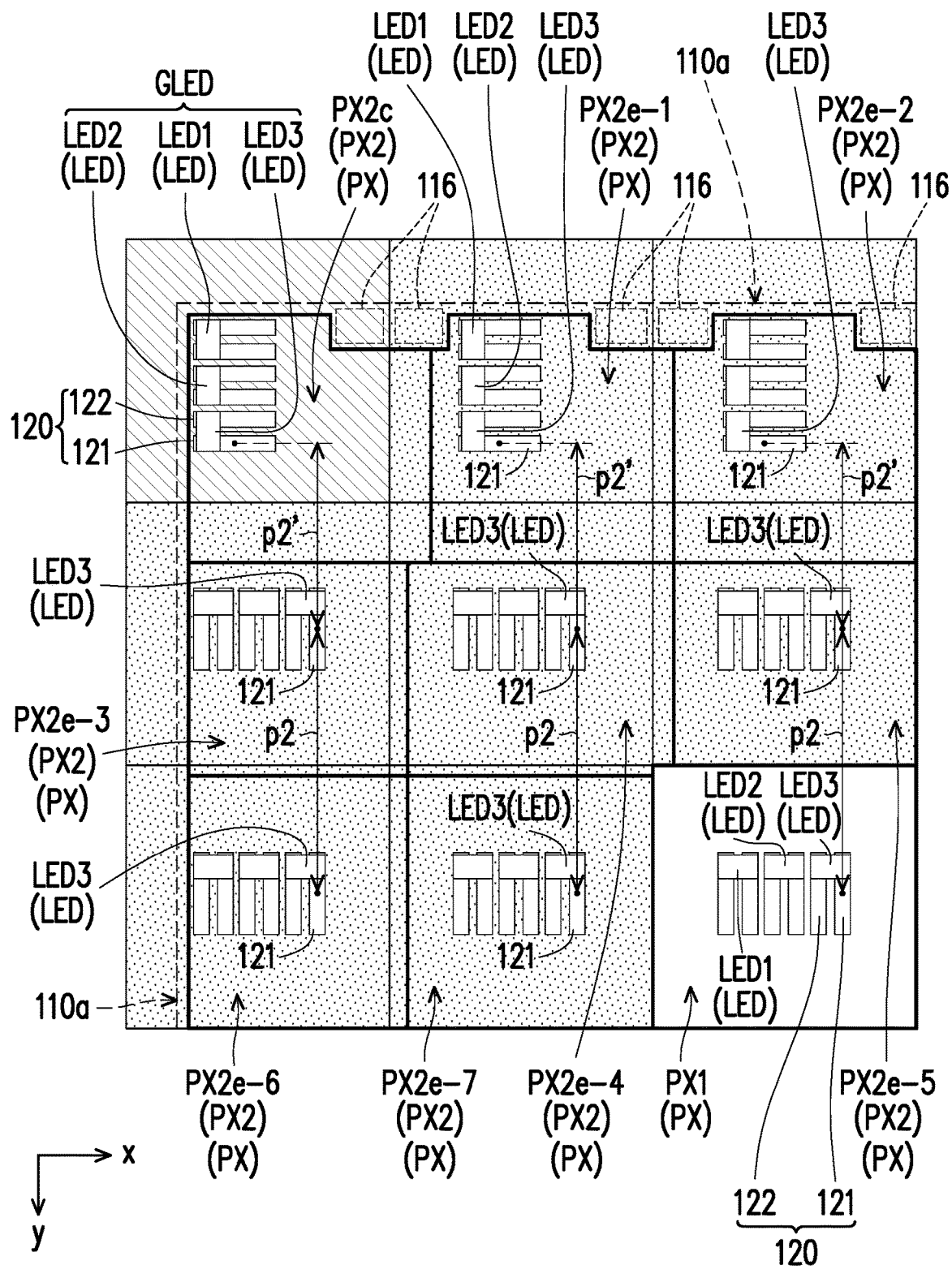
FIG. 6 is a schematic partially-enlarged view of a display device 10B according to still another embodiment of the disclosure.

FIG. 6 is a schematic partially-enlarged view of a display device 10B according to still another embodiment of the disclosure. The display device 10B of FIG. 6 is similar to the display device 10 of FIG. 2, and a difference between the two is that: in the embodiment of FIG. 2, a plurality of first pads 121 and a plurality of second pads 122 of edge pixels PX2e-3 and PX2e-6 are arranged in a second direction y, and the first pads 121 and the second pads 122 of edge pixels PX2e-1 and PX2e-2 are arranged in a first direction x; however, in the embodiment of FIG. 6, the first pads 121 and the second pads 122 of the edge pixels PX2e-3 and PX2e-6 are arranged in the first direction x, and the first pads 121 and the second pads 122 of the edge pixels PX2e-1 and PX2e-2 are arranged in a second direction y.

In the embodiment of FIG. 6, the corner pixel PX2c and the edge pixel PX2e-3 are arranged in the second direction y, and the first pad 121 and the second pad 122 of the edge pixels PX2e-3 are arranged in the first direction x. The edge pixel PX2e-5 and the standard pixel PX1 are arranged in the second direction y, and the first pad 121 and the second pad 122 of the edge pixel PX2e-5 are arranged in the first direction x. A plurality of LED elements (for example, but not limited to an LED 3) electrically connected to the pad group 120 of the corner pixel PX2c, the pad group 120 of the edge pixel PX2e-3, the pad group 120 of the edge pixel PX2e-5, and the pad group 120 of standard pixel PX1, respectively, are configured to display the same color. A distance p2' exists between the first pad 121 of the pad group 120 of the corner pixel PX2c and the first pad 121 of the pad group 120 of the edge pixel PX2e-3 in the second direction y. A distance p2 exists between the first pad 121 of the pad group 120 of the edge pixel PX2e-5 and the first pad 121 of the pad group 120 of the standard pixel PX1 in the second direction y, and the distance p2' is different from the distance p2.

Figure 7:
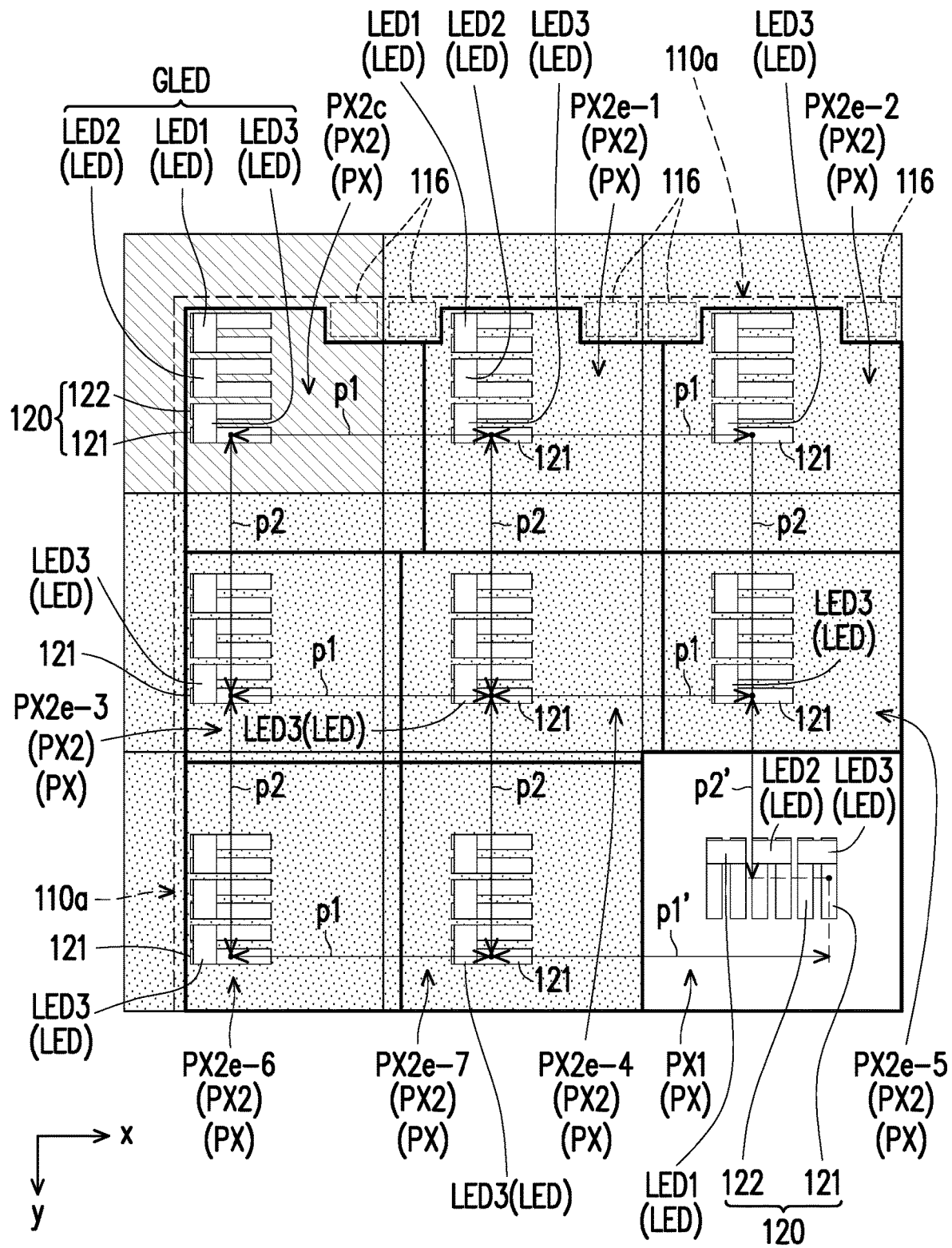
FIG. 7 is a schematic partially-enlarged view of a display device 10C according to yet another embodiment of the disclosure.

FIG. 7 is a schematic partially-enlarged view of a display device 10C according to yet another embodiment of the disclosure. The display device 10C of FIG. 7 is similar to the display device 10 of FIG. 2, and a difference between the two is that: in the embodiment of FIG. 2, a plurality of first pads 121 and a plurality of second pads 122 of edge pixels PX2e-1, PX2e-2, PX2e-4, PX2e-5, and PX2e-7 are arranged in a first direction x; in the embodiment of FIG. 7, the first pads 121 and the second pads 122 of the edge pixels PX2e-1, PX2e-2, PX2e-4, PX2e-5, and PX2e-7 are arranged in a second direction y.

In the embodiment of FIG. 7, the edge pixels PX2e-2, the edge pixels PX2e-5, and the standard pixels PX1 are sequentially arranged in the second direction y. A plurality of LED elements (for example, but not limited to an LED 3) electrically connected to the pad group 120 of the corner pixel PX2e-2, the pad group 120 of the edge pixel PX2e-5, and the pad group 120 of the standard pixel PX1, respectively, are configured to display the same color. A distance p2 exists between the first pad 121 of the pad group 120 of the edge pixel PX2e-2 and the first pad 121 of the pad group 120 of the edge pixel PX2e-5 in the second direction y. A distance p2' exists between the first pad 121 of the pad group 120 of the edge pixel PX2e-5 and the first pad 121 of the pad group 120 of the standard pixel PX1 in the second direction y, and the distance p2' is different from the distance p2.

In the embodiment of FIG. 7, the edge pixels PX2e-6, the edge pixels PX2e-7, and the standard pixels PX1 are sequentially arranged in the first direction x. A plurality of LED elements (for example, but not limited to an LED 3) electrically connected to the pad group 120 of the edge pixel PX2e-6, the pad group 120 of the edge pixel PX2e-7, and the pad group 120 of the standard pixel PX1, respectively, are configured to display the same color. A distance p1 exists between the first pad 121 of the pad group 120 of the edge pixel PX2e-6 and the first pad 121 of the pad group 120 of the edge pixel PX2e-7 in the first direction x. A distance p1' exists between the first pad 121 of the pad group 120 of the edge pixel PX2e-7 and the first pad 121 of the pad group 120 of the standard pixel PX1 in the first direction x, and the distance p1' is different from the distance p1.

Figure 8:
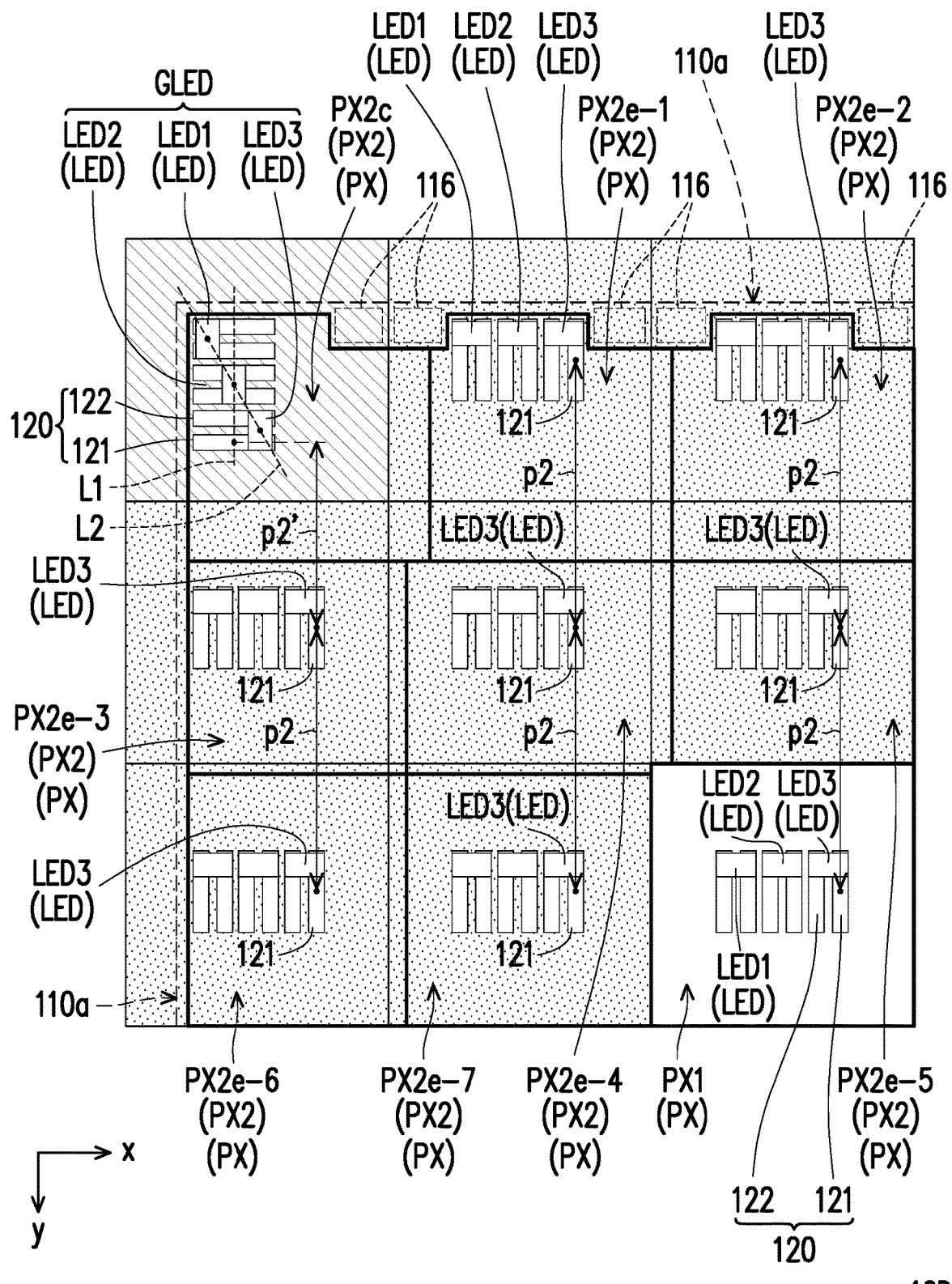
FIG. 8 is a schematic partially-enlarged view of a display device 10D according to an embodiment of the disclosure.

FIG. 8 is a schematic partially-enlarged view of a display device 10D according to an embodiment of the disclosure. The display device 10D of FIG. 8 is similar to the display device 10A of FIG. 5, and a difference between the two is that: in the embodiment of FIG. 8, a connection line L1 between geometric centers of a plurality of first pads 121 and a plurality of second pads 122 of a plurality of pad groups 120 of at least one peripheral pixel PX2 (for example, but not limited to a corner pixel PX2c) is not parallel to and crosses over a connection line L2 between geometric centers of a plurality of LED elements LED in the peripheral pixels PX2.

Figure 9:
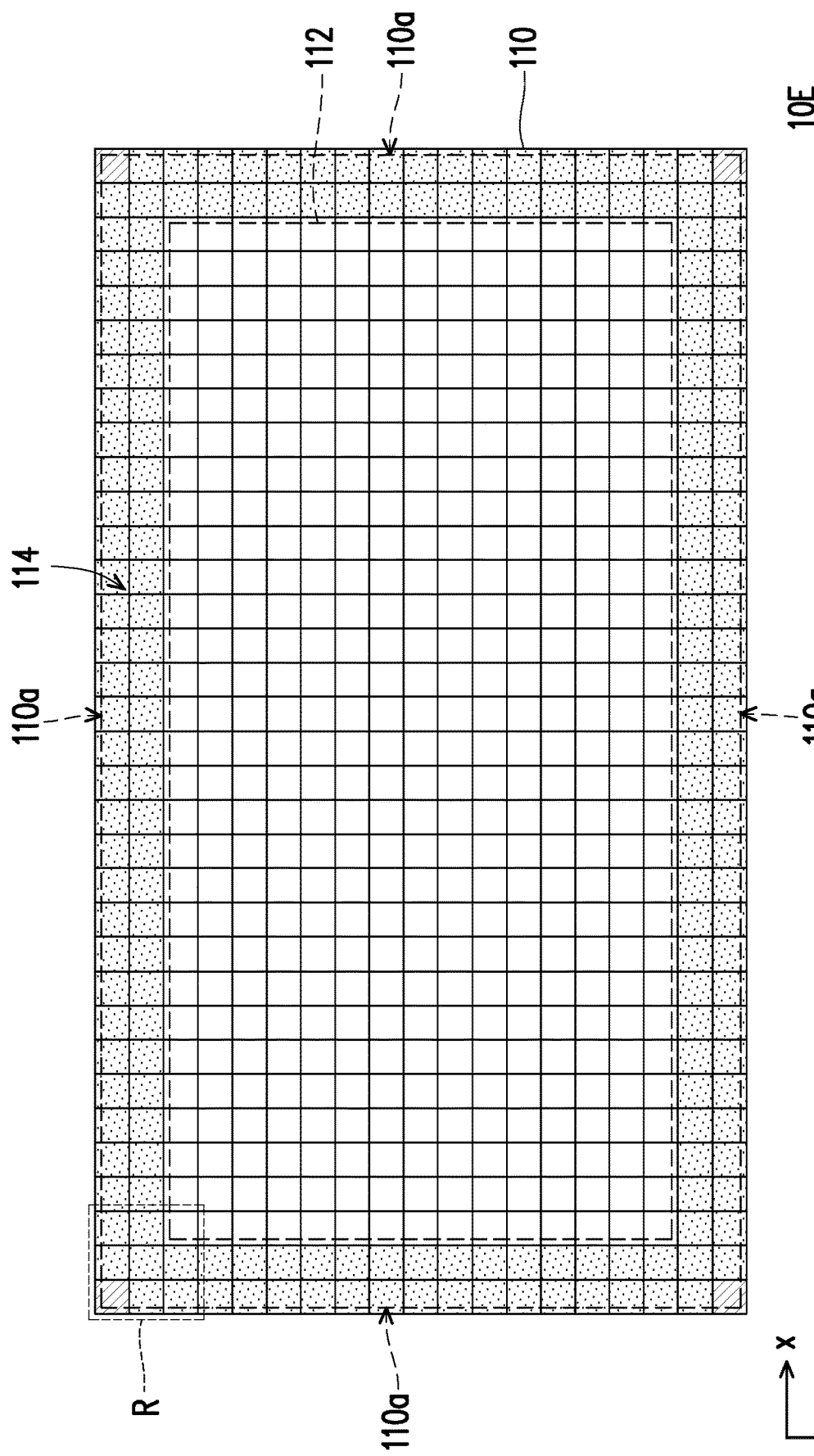
FIG. 9 is a schematic top view of a display device 10E according to another embodiment of the disclosure.

FIG. 9 is a schematic top view of a display device 10E according to another embodiment of the disclosure. FIG. 9 shows a substrate 110 but omits other components of the display device 10E.

Figure 10:
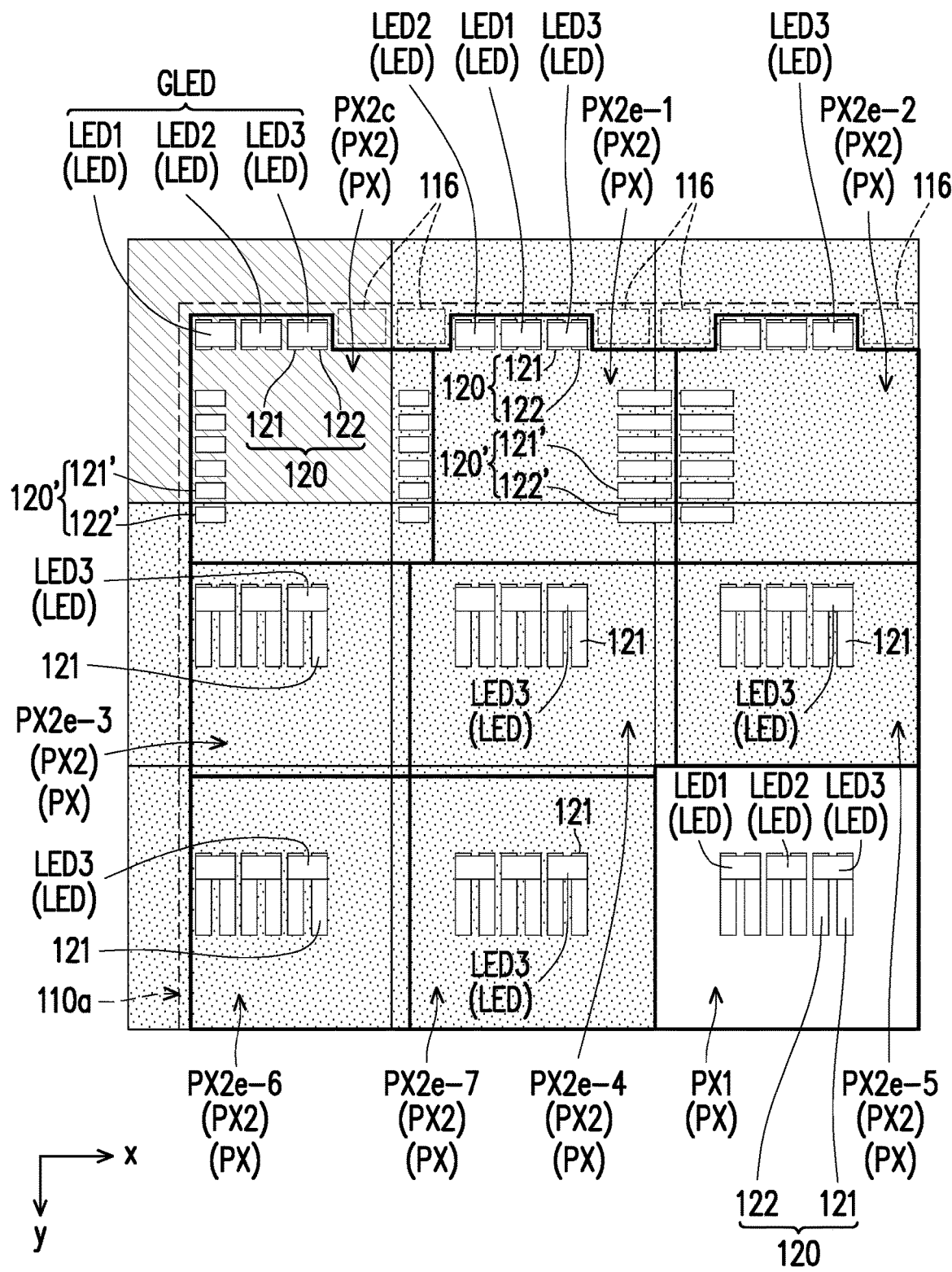
FIG. 10 is a schematic partially-enlarged view of a display device 10E according to another embodiment of the disclosure.

FIG. 10 is a schematic partially-enlarged view of a display device 10E according to another embodiment of the disclosure. FIG. 10 corresponds to a region R of FIG. 9. FIG. 10 shows a plurality of first pads 121, a plurality of second pads 122, a plurality of third pads 121', a plurality of fourth pads 122', a plurality of LED elements LED, and side pad regions 116 of the substrate 110, but omits other components of the display device 10E.

Figure 11:
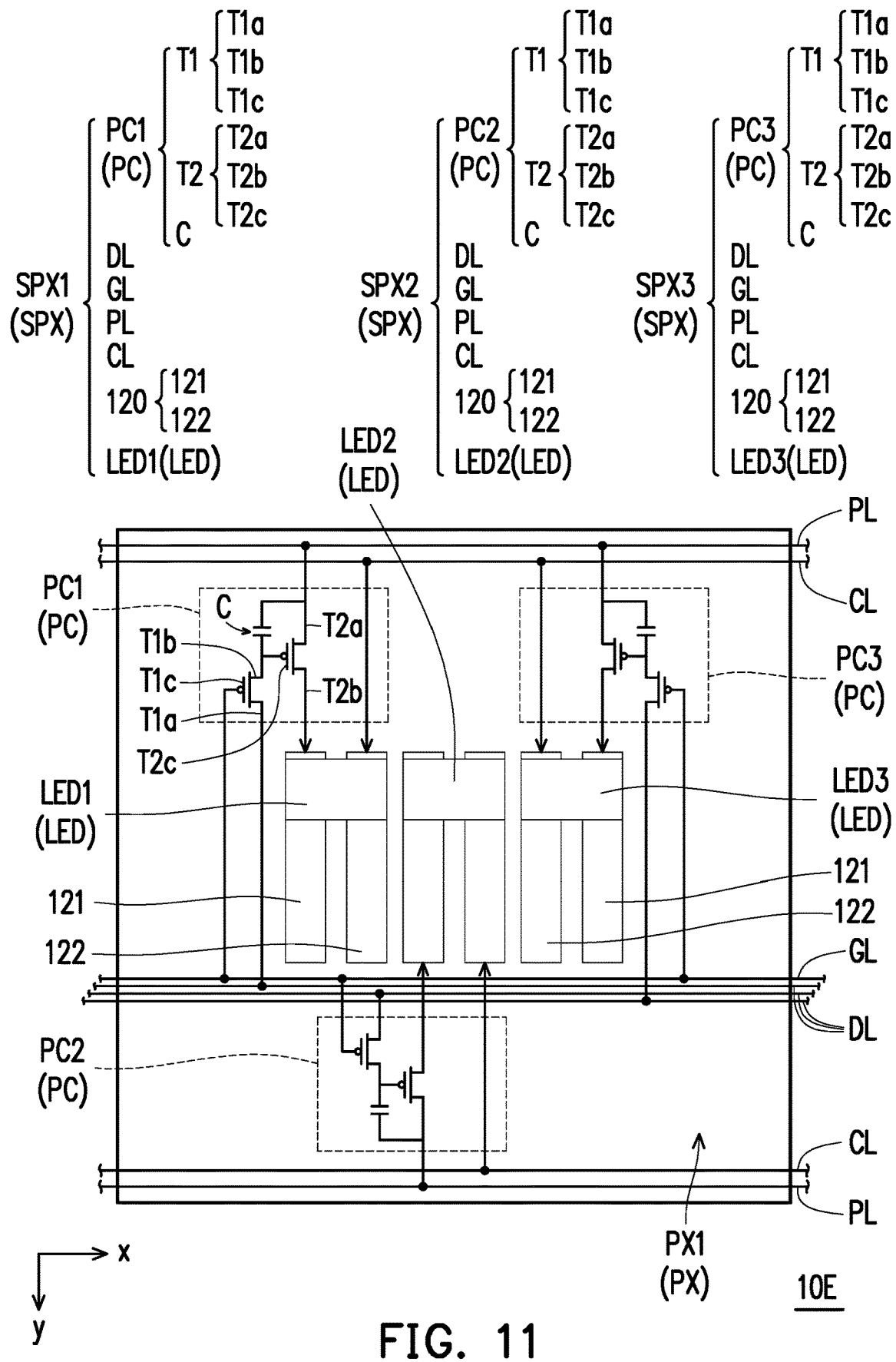
FIG. 11 is a schematic enlarged view of a standard pixel PX1 in FIG. 10.

FIG. 11 is a schematic enlarged view of a standard pixel PX1 in FIG. 10.

Figure 12:
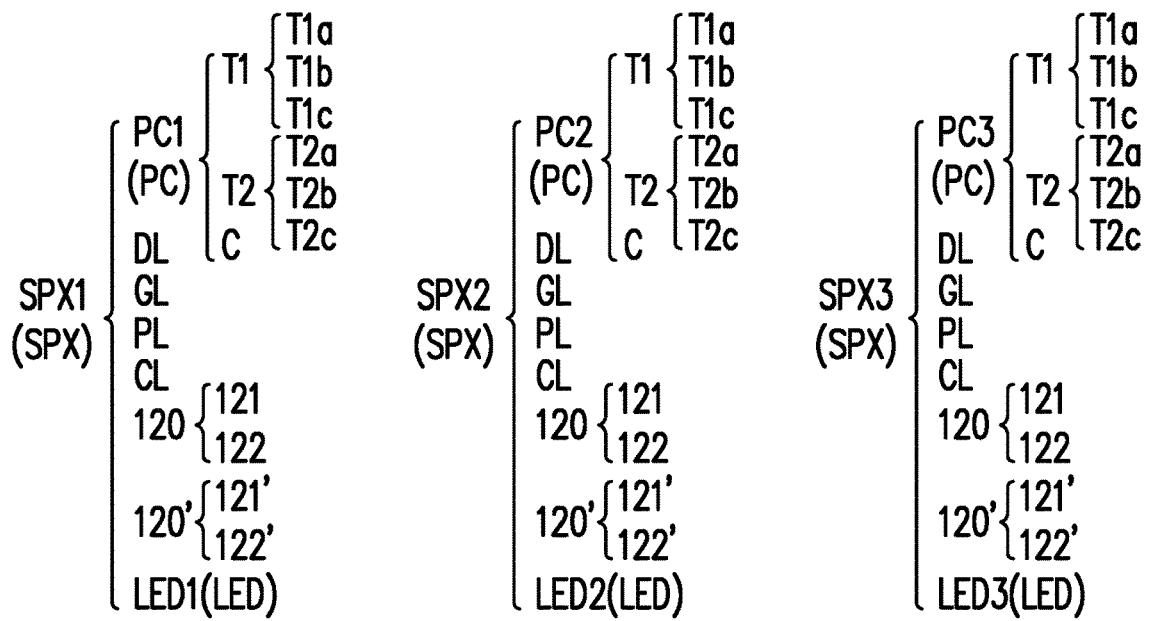
FIG. 12 is a schematic enlarged view of a corner pixel PX2$c$ in FIG. 10.
Figure 12:
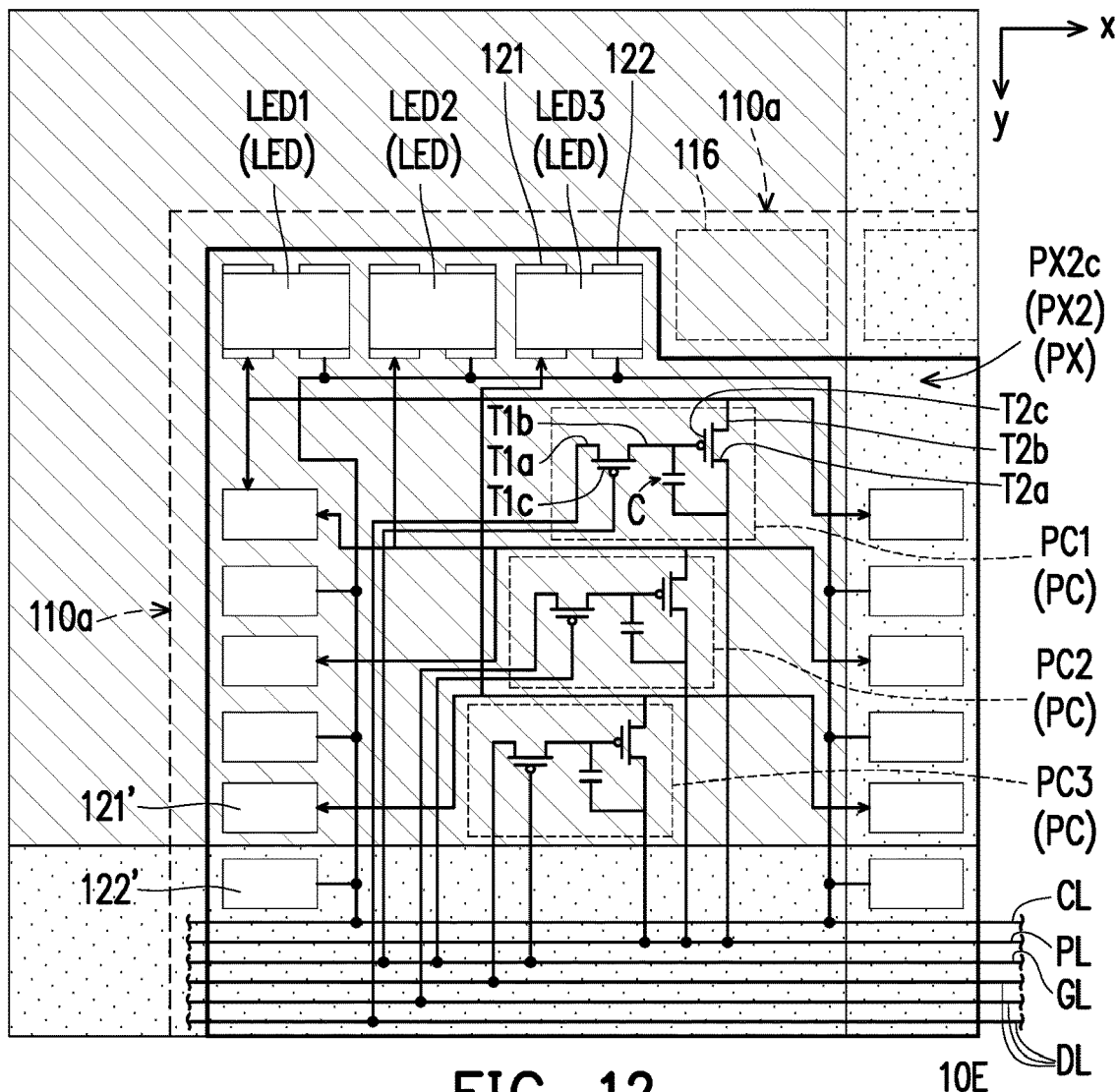

FIG. 12 is a schematic enlarged view of a corner pixel PX2c in FIG. 10.

Figure 13:
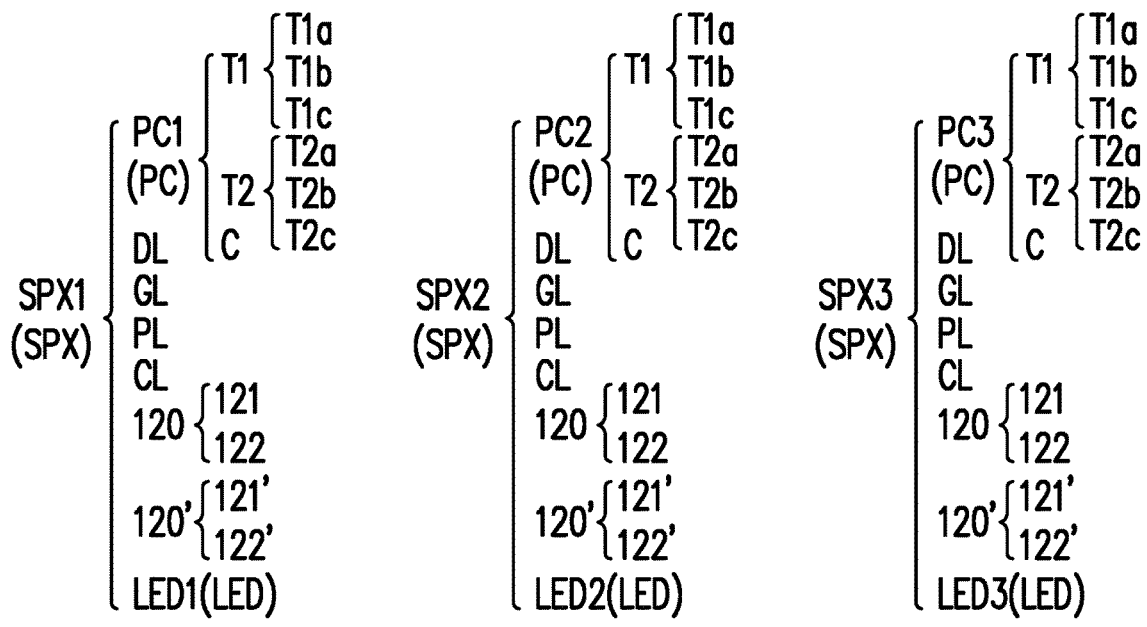
FIG. 13 is a schematic enlarged view of an edge pixel PX2$e$-1 in FIG. 10.
Figure 13:
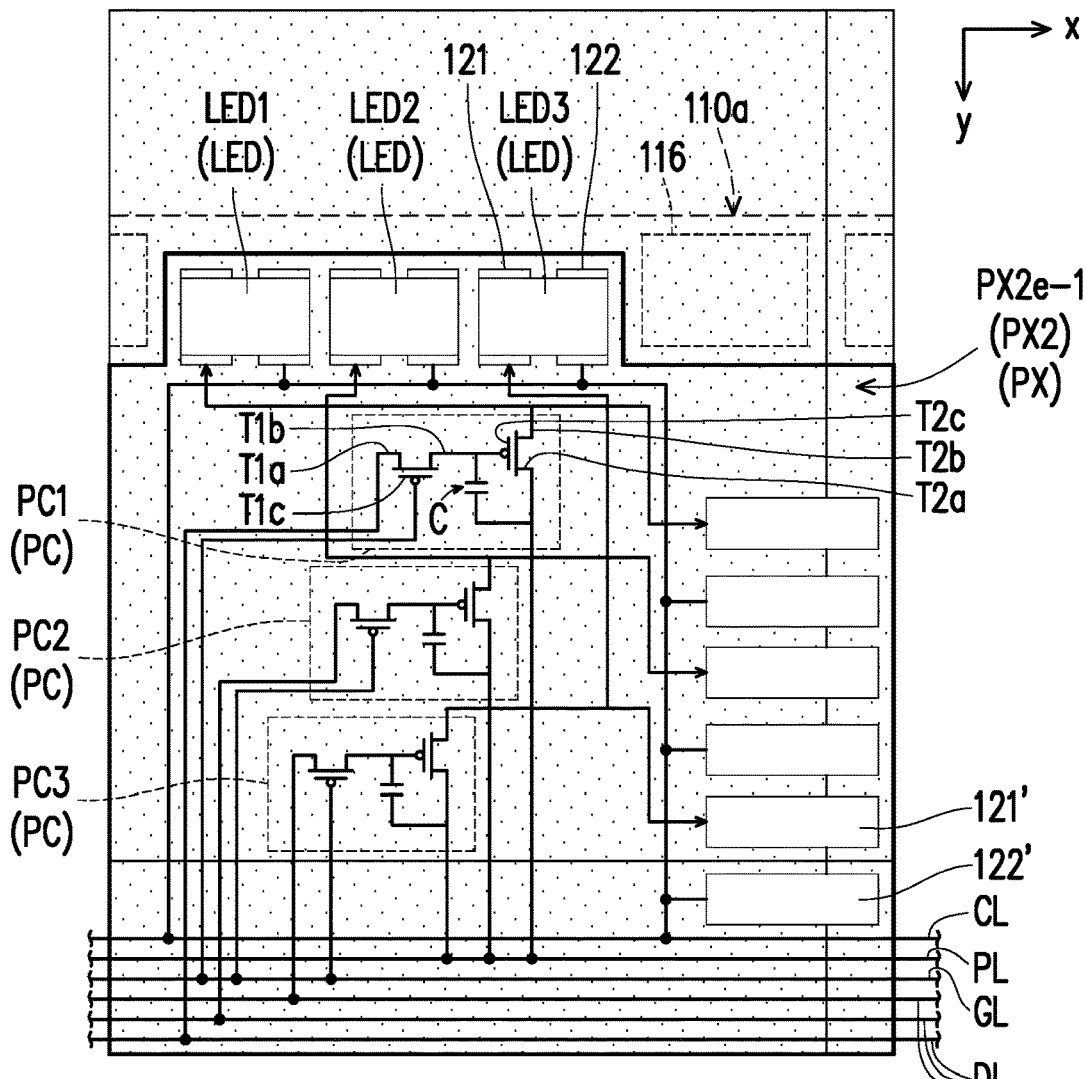

FIG. 13 is a schematic enlarged view of an edge pixel PX2e-1 in FIG. 10.

The display device 10E of the embodiments of FIG. 9 to FIG. 13 is similar to the display device 10 of the embodiments of FIG. 1 to FIG. 4. Differences between the two are as follows.

Referring to FIG. 10 and FIG. 12, in this embodiment, a sub-pixel SPX of at least one peripheral pixel PX2 includes a plurality of pad groups 120, 120' that are structurally separated from each other and arranged in different directions. The pad group 120 of the sub-pixel SPX of the at least one peripheral pixel PX2 includes a first pad 121 and a second pad 122, and the pad group 120' of the sub-pixel SPX of the at least one peripheral pixel PX2 includes a third pad 121' and a fourth pad 122'. The first pad 121, the second pad 122, the third pad 121', and the fourth pad 122' are structurally separated, and the first pad 121 and the second pad 122 of the sub-pixel SPX of the at least one peripheral pixel PX2 are arranged in a first direction x. The third pad 121' of the pad group 120' of the sub-pixel SPX of the at least one peripheral pixel PX2 is electrically connected to a second terminal T2b of a second transistor T2 of the peripheral pixel PX2, and the fourth pad 122' of the pad group 120' of the sub-pixel SPX of the at least one peripheral pixel PX2 is electrically connected to a common line CL, the third pad 121' and the fourth pad 122' are arranged in a second direction y crossing over the first direction x.

Referring to FIG. 10 and FIG. 12, for example, in this embodiment, a sub-pixel SPX of a corner pixel PX2c includes a plurality of pad groups 120, 120' that are structurally separated from each other and arranged in different directions. The pad group 120 of the sub-pixel SPX of the corner pixel PX2c includes the first pad 121 and the second pad 122, and the pad group 120' of the sub-pixel SPX of the corner pixel PX2c includes the third pad 121' and the fourth pad 122'. The first pad 121, the second pad 122, the third pad 121', and the fourth pad 122' are structurally separated. The first pad 121 and the second pad 122 of the sub-pixel SPX of the corner pixel PX2c are arranged in the first direction x. The third pad 121' of the pad group 120' of the sub-pixel SPX of the corner pixel PX2c is electrically connected to the second terminal T2b of the second transistor T2 of the corner pixel PX2c, and the fourth pad 122' of the pad group 120' of the sub-pixel SPX of the corner pixel PX2c is electrically connected to the common line CL, and the third pad 121' and the fourth pad 122' are arranged in the second direction y crossing over the first direction x.

Referring to FIG. 10 and FIG. 13, for example, in this embodiment, a sub-pixel SPX of the edge pixel PX2e-1 includes a plurality of pad groups 120, 120' that are structurally separated from each other and arranged in different directions. The pad group 120 of the sub-pixel SPX of the edge pixel PX2e-1 includes the first pad 121 and the second pad 122, and the pad group 120' of the sub-pixel SPX of the edge pixel PX2e-1 includes the third pad 121' and the fourth pad 122'. The first pad 121, the second pad 122, the third pad 121', and the fourth pad 122' are structurally separated. The first pad 121 and the second pad 122 of the sub-pixel SPX of the edge pixel PX2e-1 are arranged in the first direction x. The third pad 121' of the pad group 120' of the sub-pixel SPX of the edge pixel PX2e-1 is electrically connected to the second terminal T2b of the second transistor T2 of the corner pixel PX2c, and the fourth pad 122' of the pad group 120' of the sub-pixel SPX of the edge pixel PX2e-1 is electrically connected to the common line CL, and the third pad 121' and the fourth pad 122' are arranged in the second direction y crossing over the first direction x.

Referring to FIG. 10, during initial manufacturing of the display device 10E, the pad group 120 of the standard pixel PX1 and the peripheral pixel PX2 is to be engaged with the LED element LED. Thereafter, if it is found that at least one peripheral pixel PX2 of the display device 10E needs to be repaired, the LED element LED on the pad group 120 of at least one peripheral pixel PX2 may be removed, and another LED element LED may be transferred onto the pad group 120' of the at least one peripheral pixel PX2. In other words, the pad group 120 is a bonding region of the at least one peripheral pixel PX2, and the pad group 120' is a spare region for repairing the at least one peripheral pixel PX2. Because the bonding region (that is, the first pad 121 and the second pad 122 of the pad group 120) of the at least one peripheral pixel PX2 and the spare region (that is, the third pad 121' and the fourth pad 122' of the pad group 120') separated in structure and arranged in the first direction x and the second direction y different from each other, respectively, the layout of the at least one peripheral pixel PX2 is more flexible, which helps achieve the display device 10E with a slim frame design or even without frames.

In this embodiment, an area of the first pad 121 of the pad group 120 of the sub-pixel SPX of the at least one peripheral pixel PX2 is less than an area of the first pad 121 of the pad group 120 of the sub-pixel SPX of the standard pixel PX1. An area of the third pad 121' of the pad group 120' of the sub-pixel SPX of the at least one peripheral pixel PX2 is less than an area of the first pad 121 of the pad group 120 of the sub-pixel SPX of the standard pixel PX1.

For example, in this embodiment, an area of the first pad 121 of the pad group 120 of the sub-pixel SPX of the corner pixel PX2c is less than an area of the first pad 121 of the pad group 120 of the sub-pixel SPX of the standard pixel PX1. An area of the third pad 121' of the pad group 120' of the sub-pixel SPX of the corner pixel PX2c is less than an area of the first pad 121 of the pad group 120 of the sub-pixel SPX of the standard pixel PX1. An area of the third pad 121 of the pad group 120 of the sub-pixel SPX of the edge pixel PX2e-1 is less than an area of the first pad 121 of the pad group 120 of the sub-pixel SPX of the standard pixel PX1. An area of the third pad 121' of the pad group 120' of the sub-pixel SPX of the edge pixel PX2e-1 is less than an area of the first pad 121 of the pad group 120 of the sub-pixel SPX of the standard pixel PX1, but the disclosure is not limited thereto.

Furthermore, in this embodiment, the edge pixel PX2e-1 is disposed between an edge 110a of the substrate 110 and the corner pixel PX2c, and the area of the third pad 121' of the pad group 120' of the edge pixel PX2e-1 is greater than an area of the third pad 121' of the pad group 120' of the corner pixel PX2c and less than the area of the first pad 121 of the pad group 120 of the standard pixel PX1, but the disclosure is not limited thereto.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A display device, comprising:
   a substrate, having an intermediate region and a peripheral region, wherein the peripheral region is located between an edge of the substrate and the intermediate region; and
   a plurality of pixels, disposed on the substrate, wherein each of the pixels comprises a plurality of sub-pixels, and each of the sub-pixels comprises:
   a pad group, comprising a first pad and a second pad; and
   a light emitting diode element, electrically connected to the first pad and the second pad;
   wherein the pixels comprise a plurality of standard pixels disposed in the intermediate region and a plurality of peripheral pixels disposed in the peripheral region,
   the first pad and the second pad of the pad group of each of the sub-pixels of each of the standard pixels are arranged in a first direction,
   the peripheral pixels comprise a first peripheral pixel, the first pad and the second pad of the pad group of each of the sub-pixels of the first peripheral pixel are arranged in a second direction, and the first direction crosses over the second direction.

2. The display device according to claim 1, wherein the first pad of each of the sub-pixels of each of the standard pixels comprises a bonding region overlapping the light emitting diode element of each of the sub-pixels of each of the standard pixels and a spare region outside the bonding region, the first pad of each of the sub-pixels of the first peripheral pixel comprises a bonding region overlapping the light emitting diode element of each of the sub-pixels of the first peripheral pixel and a spare region outside the bonding region, and a direction in which the bonding region and the spare region of each of the sub-pixels of each of the standard pixels are arranged crosses over a direction in which the bonding region and the spare region of each of the sub-pixels of the first peripheral pixel are arranged.

3. The display device according to claim 1, the peripheral pixels further comprising:
a second peripheral pixel, wherein the first peripheral pixel and the second peripheral pixel are arranged in one of the first direction and the second direction, and the first pad and the second pad of each of the sub-pixels of the second peripheral pixel are arranged in the first direction; and
a third peripheral pixel, wherein the third peripheral pixel and one of the standard pixels are arranged in the one of the first direction and the second direction, and the first pad and the second pad of each of the sub-pixels of the third peripheral pixel are arranged in the first direction,
wherein the light emitting diode elements electrically connected to the pad groups of the first peripheral pixel, the pad groups of the second peripheral pixel, the pad groups of the third peripheral pixel, and the pad groups of the one of the standard pixels are configured to display a same color,
wherein a distance p' exists between the first pads of the pad groups of the first peripheral pixel and the first pads of the second peripheral pixel in the one of the first direction and the second direction, a distance p exists between the first pads of the pad groups of the third peripheral pixel and the first pads of the pad groups of the one of the standard pixels in the one of the first direction and the second direction, and the distance p' is different from the distance p.

4. The display device according to claim 3, wherein the distance p and the distance p' satisfy: $|p'-p|/p \leq 5\%$.

5. The display device according to claim 1, the peripheral pixels further comprising:
a fourth peripheral pixel, wherein the first peripheral pixel, the fourth peripheral pixel, and one of the standard pixels are sequentially arranged in one of the first direction and the second direction, and the first pads and the second pads of the sub-pixels of the fourth peripheral pixel are arranged in the second direction;
wherein the light emitting diode elements electrically connected to the pad groups of the first peripheral pixel, the pad groups of the fourth peripheral pixel, and the pad groups of the one of the standard pixels are configured to display a same color;
wherein a distance p exists between the first pads of the pad groups of the first peripheral pixel and the first pads of the fourth peripheral pixel in the one of the first direction and the second direction, a distance p' exists between the first pads of the pad groups of the fourth peripheral pixel and the first pads of the pad groups of the one of the standard pixels in the one of the first direction and the second direction, and the distance p' is different from the distance p.

6. The display device according to claim 5, wherein the distance p and the distance p' satisfy: $|p'-p|/p \leq 5\%$.

7. A display device, comprising:
a substrate, comprising an intermediate region and a peripheral region, wherein the peripheral region is located between an edge of the substrate and the intermediate region; and
a plurality of pixels, disposed on the substrate, wherein each of the pixels comprises a plurality of sub-pixels, and each of the sub-pixels comprises:
a pixel driving circuit, comprising a first transistor and a second transistor, wherein the first transistor comprises a first terminal, a second terminal, and a control terminal, the second transistor comprises a first terminal, a second terminal, and a control terminal, and the second terminal of the first transistor is electrically connected to the control terminal of the second transistor;
a first pad group, comprising a first pad and a second pad, wherein the first pad is electrically connected to the second terminal of the second transistor; and
a light emitting diode element, electrically connected to the first pad and the second pad;
wherein the pixels comprise a plurality of standard pixels disposed in the intermediate region and a plurality of peripheral pixels disposed in the peripheral region,
the first pad and the second pad of the first pad group of each of the sub-pixels of each of the standard pixels are arranged in a first direction,
the peripheral pixels comprise a first peripheral pixel, the first pad and the second pad of the first pad group of each of the sub-pixels of the first peripheral pixel are arranged in the first direction,
each of the sub-pixels of the first peripheral pixel further comprises a second pad group, the second pad group comprises a third pad and a fourth pad, the first pad, the second pad, the third pad, and the fourth pad of the first peripheral pixel are structurally separated, the third pad is electrically connected to the second terminal of the second transistor of each of the sub-pixels of the first peripheral pixel, the third pad and the fourth pad are arranged in a second direction, and the first direction crosses over the second direction.

8. The display device according to claim 7, wherein an area of the first pad of the first pad group of each of the sub-pixels of the first peripheral pixel is less than an area of the first pad of the first pad group of each of the sub-pixels of each of the standard pixels.

9. The display device according to claim 7, wherein an area of the third pad of the second pad group of each of the sub-pixels of the first peripheral pixel is less than an area of the first pad of the first pad group of each of the sub-pixels of each of the standard pixels.

10. The display device according to claim 7, wherein the peripheral pixels further comprise:
a second peripheral pixel, wherein the first peripheral pixel is disposed between the edge of the substrate and the second peripheral pixel, the first pad and the second pad of the first pad group of each of the sub-pixels of the second peripheral pixel are arranged in the first direction, each of the sub-pixels of the second peripheral pixel further comprises a second pad group, and the second pad group comprises a third pad and a fourth pad, wherein the third pad of the second pad group of each of the sub-pixels of the second peripheral pixel is electrically connected to the second terminal of the second transistor of each of the sub-pixels of the second peripheral pixel, the third pad and the fourth pad of the second pad group of each of the sub-pixels of the second peripheral pixel are arranged in the second direction, and an area of the third pad of the second pad group of each of the sub-pixels of the second peripheral pixel is greater than an area of the third pad of the second pad group of each of the sub-pixels of the first peripheral pixel and less than an area of the first pad of the first pad group of each of the sub-pixels of each of the standard pixels.

\* \* \* \* \*